United States Patent [19]

Murakami et al.

[11] Patent Number: 4,998,503

[45] Date of Patent: * Mar. 12, 1991

[54] APPARATUS FOR FORMING FUNCTIONAL DEPOSITED FILM BY MICROWAVE PLASMA CVD PROCESS

[75] Inventors: Tsutomu Murakami, Nagahama; Masahiro Kanai, Tokyo, both of Japan

[73] Assignee: Canon Kabushiki Kaisha, Tokyo, Japan

[*] Notice: The portion of the term of this patent subsequent to Feb. 6, 2007 has been disclaimed.

[21] Appl. No.: 430,246

[22] Filed: Nov. 2, 1989

Related U.S. Application Data

[63] Continuation of Ser. No. 252,525, Oct. 3, 1988, Pat. No. 4,898,118.

[30] Foreign Application Priority Data

Oct. 5, 1987 [JP] Japan .................................. 62-249855

[51] Int. Cl.$^5$ .............................................. C23C 16/48
[52] U.S. Cl. .................................................. 118/723
[58] Field of Search ......................................... 118/723

[56] References Cited

U.S. PATENT DOCUMENTS 4,401,054  8/1983  Matsuo ............................... 118/723
4,532,199  7/1985  Ueno ................................... 427/39

Primary Examiner—Richard Bueker
Attorney, Agent, or Firm—Fitzpatrick, Cella, Harper & Scinto

[57] ABSTRACT

Disclosed herein is an apparatus for forming a deposited film by a microwave plasma CVD process comprising introducing a film-forming raw material gas into a reaction vessel capable of being vacuum sealed, and generating a microwave-excited plasma in the reaction vessel to deposit a film on a substrate for film deposition disposed in the reaction vessel. The apparatus comprises a waveguide for transmitting microwave energy, a pair of microwave cutoff cavities having different cutoff frequencies, the cavities being oppositely disposed on opposite sides of the waveguide, and a reaction vessel disposed to penetrate through the waveguide and the microwave cutoff cavities, wherein a raw material gas inlet is provided at one end of the reaction vessel, and a film deposition space is provided at the other end of the reaction vessel, whereby it is possible to use effectively the plasma generated in the reaction vessel for film deposition without leakage of the plasma into the cavity on the gas inlet side, and to perform stable film deposition with good reproducibility.

2 Claims, 3 Drawing Sheets

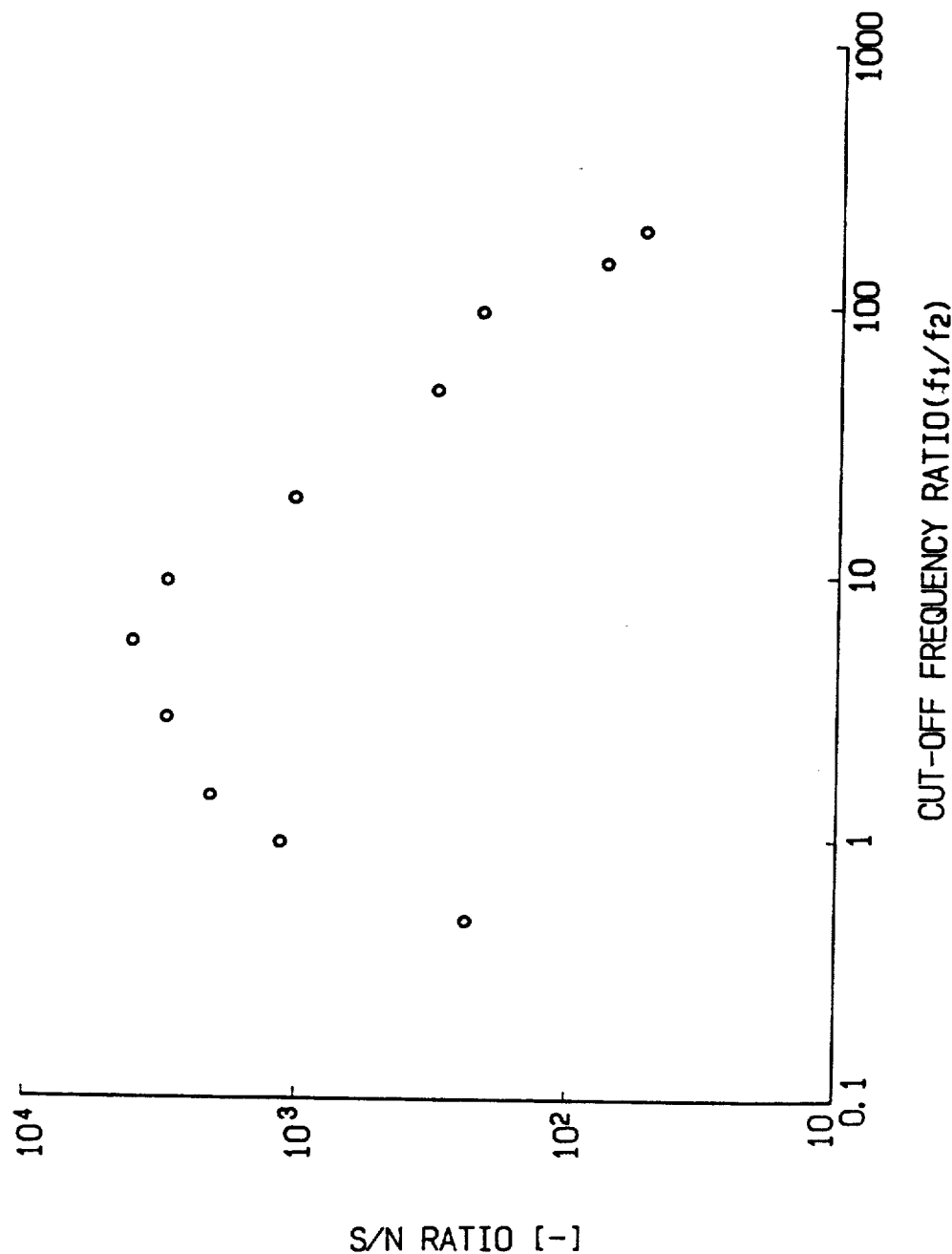

APPARATUS FOR FORMING FUNCTIONAL DEPOSITED FILM BY MICROWAVE PLASMA CVD PROCESS

This application is a continuation of application Ser. No. 252,525 filed Oct. 3, 1988, now U.S. Pat. No. 4,898,118.

FIELD OF THE INVENTION

This invention relates to an apparatus for forming a functional deposited film by a microwave plasma CVD process by which the functional deposited film can be formed efficiently. More particularly, it relates to an apparatus for forming a functional deposited film by way of a microwave plasma CVD process in which a raw material gas and a plasma generated may be used at enhanced efficiency.

BACKGROUND OF THE INVENTION

It is known that amorphous silicon (hereinafter referred to simply as "A-Si") may be formed in a desired shape or into a large-area body. Application of amorphous silicon to various uses, for instance, electrophotographic photosensitive members, solar cells and thin-film transistors has been investigated and put to practical use. For production of deposited films of A-Si, there have been known a vacuum vapor deposition process, a thermal-induced CVD process, a sputtering process, an ion plating process, a plasma CVD process, etc., among these processes, the plasma CVD process has been highly evaluated and widely used. A variety of processes and apparatuses for carrying out such processes have been proposed, and some of them have been put to practical use.

As for the conventional A-Si deposited films, they are still not sufficient enough for their electrical and optical characteristics. And there are problems even for the plasma CVD process and also for the apparatus for carrying out the process that there are a great number of parameters due to the use of a plasma, and it is difficult to generalize such parameters. In addition, there are other problems that the use efficiency of raw material gas is low, the film deposition rate is low, etc.

In order to solve the above problems, a variety of proposals have been made. For instance, according to Japanese Patent Application Laid-Open No. 60-4047 (1985), there is proposed a method of exciting and decomposing a raw material gas for forming a deposited film by predetermined energy in a space other than a film deposition space to produce activated species, and using the activated species to form the deposited film on the surface of a substrate disposed in the film deposition space, and an apparatus for carrying out the method. It is also proposed to use microwave energy for excitation and decomposition of the film-forming raw material gas to produce the activated species.

According to the proposal mentioned above, the apparatus for carrying out the method of forming a deposited film by use of microwave energy has a construction in which a pair metallic pipe opened at both ends are connected near a trailing end portion of a rectangular waveguide on a plane perpendicular to an electric field generated, so as to penetrate through the waveguide, and a portion of a reaction vessel is extended to be contained in the pair of pipes. According to the apparatus construction, the both-end-open metallic pipes (hereinafter referred to as "microwave cutoff cavities") generally are disposed at symmetrical positions with respect to a waveguide for transmitting microwaves, or microwave waveguide, and are so designed as to prevent microwave energy from leaking to the exterior and as to have an equal microwave cutoff frequency. In addition, the apparatus is so designed that the plasma generated by the microwave energy is confined in the cavities. The microwave cutoff frequency of the cavities is generally about two times the frequency of the microwaves used.

In the apparatus proposed as above, however, the plasma generated by the microwave energy often leaks to the exterior without being confined perfectly in the microwave cutoff cavities. This phenomenon takes place in both the microwave cutoff cavity on the film deposition chamber side of the reaction vessel and the cavity on the raw material gas inlet side of the vessel. As a result, the input efficiency of the microwave energy is lowered, causing instability of the quantity of the plasma leaking, and the deposited film thus formed is uneven in film thickness and film quality becomes undesirable, leading finally to poor reproducibility of characteristics of the film. To overcome the problems, separate operations are adopted for strictly controlling the microwave power inputted, for setting the appropriate spacing between a plasma generation zone and the substrate in the film deposition chamber, and so on. In any case, the operations are complicated and troublesome, and it is difficult to obtain the desired functional deposited film steadily and stably.

SUMMARY OF THE INVENTION

It is a primary object of this invention to provide an apparatus which overcomes the above-mentioned drawbacks of the conventional apparatuses for forming a deposited film by the microwave plasma CVD process (hereinafter referred to simply as "MW-PCVD process") and which makes it possible to obtain the desired functional deposited film steadily and stably.

It is another object of this invention is to provide an apparatus for forming a deposited film by the MW-PCVD process which enhances the use efficiency of a raw material gas and a plasma generated and which enables efficient formation of the desired functional deposited film at high deposition rate.

Accordingly, this invention provides an apparatus for forming a deposited film by a microwave plasma CVD process comprising introducing a film-forming raw material gas into a reaction vessel capable of being vacuum sealed, and generating a microwave-excited plasma into the reaction vessel to deposit a film on a substrate for film deposition disposed in the reaction vessel, the apparatus comprising a waveguide for transmitting microwave energy, a pair of microwave cutoff cavities being oppositely disposed on opposite sides of the waveguide, and a reaction vessel disposed to penetrate through the waveguide and the microwave cutoff cavities, wherein a raw material gas inlet is provided at one end of the reaction vessel, and a film deposition space is provided at the other end of the reaction vessel.

BRIEF DESCRIPTION OF THE DRAWINGS

FIG. 2 and FIG. 3 are graphs showing the relationships between cutoff frequency ratio and light conductivity obtained in Test Examples 1 and 2, respectively.

DETAILED DESCRIPTION OF THE INVENTION

Figure 1:
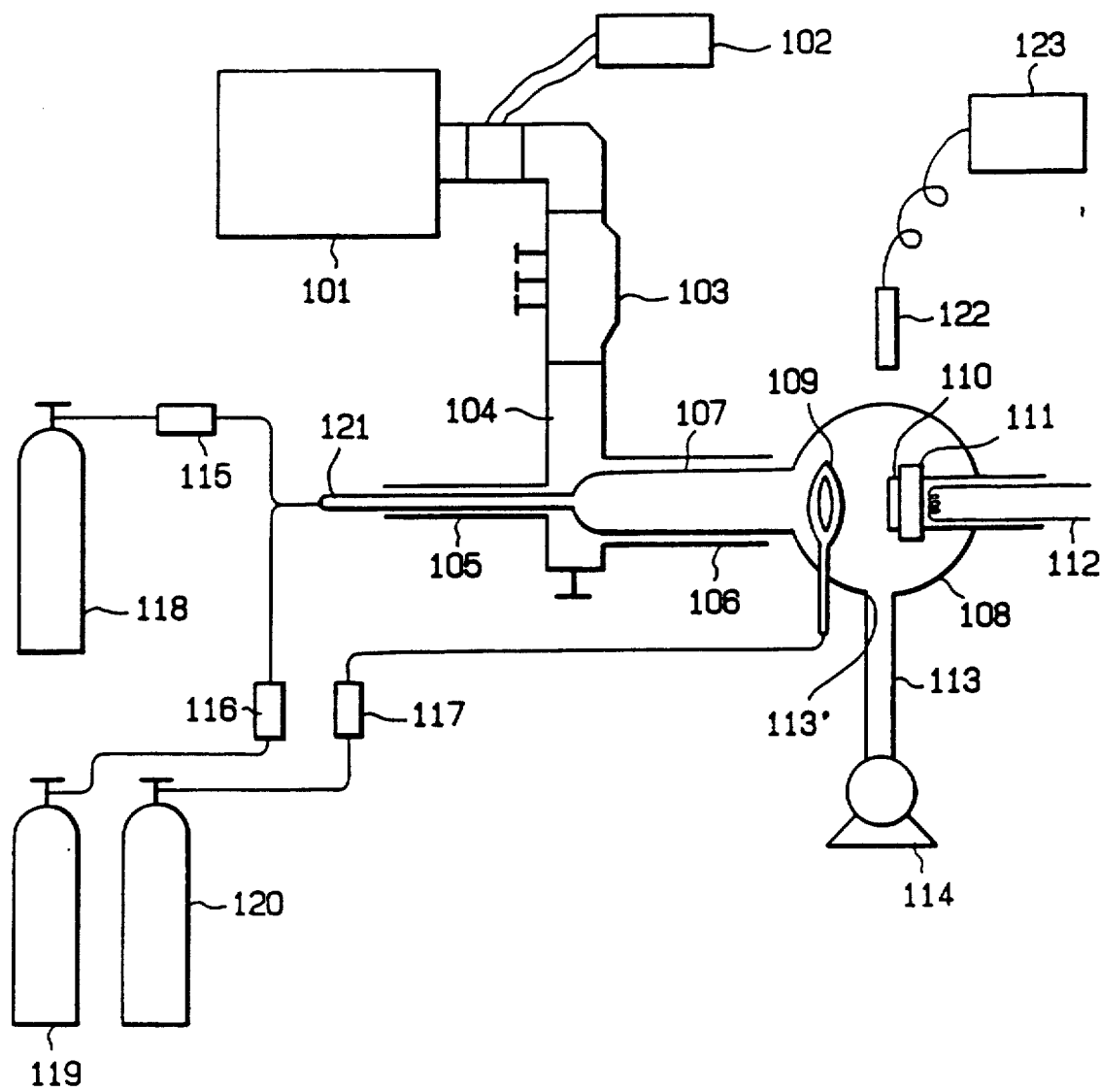
FIG. 1 is a sectional schematic illustration of a typical embodiment of the microwave plasma CVD apparatus according to this invention.

In the apparatus for forming a deposited film by the MW-PCVD process according to this invention, of the above-mentioned construction, the reaction vessel is provided with the raw material gas inlet on the side of one of the microwave cutoff cavities which one has a higher microwave cutoff frequency, and the reaction vessel is provided with the film deposition space on the side of the other microwave cutoff cavity having a lower microwave cutoff frequency, whereby the microwave energy supplied through the waveguide is supplied only into the cavity on the side of the film deposition space, without leaking into the cavity on the side of a gas inlet pipe. Therefore, the plasma is generated only in the cavity on the side of the film deposition space, so that it is possible to produce efficiently activated species for forming the deposited film, and to introduce efficiently the activated species into the film deposition space.

Furthermore, in the apparatus for forming the deposited film by the MW-PCVD process according to this invention, the plasma is generated only in a restricted narrow region. Therefore, it is possible to perform stable formation of the deposited film with good reproducibility, and to prevent or minimize contamination by the materials constituting the reaction vessel.

This invention will now be explained more in detail while referring to the drawings, but the invention is not limited in any way by the following description.

FIG. 1 is a sectional schematic illustration of one typical embodiment of the apparatus for forming a deposited film by the MW-PCVD process according to this invention.

In the figure, numeral 101 denotes a microwave power source, 102 a power meter, 103 a matching devices, 104 a waveguide, 105 a first microwave cutoff cavity, 106 a second microwave cutoff cavity, 107 a reaction vessel, 108 a film deposition space, 109 a gas inlet pipe, 110 a substrate for film deposition, 111 a substrate holder, 112 a heater for heating the substrate, 113 an exhaust pipe, 113' an exhaust port, 114 an exhaust system, 115 to 117 each denote a mass flow controller, 118 to 120 each denote a raw material gas cylinder, and 121 denotes a raw material gas inlet.

In the apparatus shown in FIG. 1, microwaves supplied from the microwave power source 101 are transmitted through the matching device 103 and the waveguide 104 to generate a plasma in the reaction vessel 107. The frequency of the microwaves used is generally 1.45 GHz, but microwaves of other frequencies may be appropriately used, as desired. The size and shape of the waveguide 104 are determined by the frequency of the microwave power source 101. For example, when microwaves of a frequency of 2.45 GHz are used, a rectangular waveguide conforming to WRJ-2 specified by Japanese Industrial Standards (JIS) can be used.

In the vicinity of the trailing end of the waveguide 104, the first microwave cutoff cavity 105 and the second microwave cutoff cavity 106 are oppositely arranged on opposite sides of the waveguide, in a plane perpendicular to an electric field or a magnetic field. The reaction vessel 107 is disposed to penetrate through the interior of the first and second microwave cutoff cavities 105 and 106 and the waveguide 104. The first and second cavities 105, 106 are each constituted of a metallic pipe opened at both ends. The metallic pipe may be rectangular or cylindrical in shape, and the shape is suitably determined in relation to the reaction vessel 107, as desired. The reaction vessel 107 is formed of a material capable of transmitting microwave energy, for example, a ceramic such as silica glass, alumina, silicon nitride, boron nitride, alumina nitride, etc.

The reaction vessel 107 is provided with the gas inlet at its tip on the side of the first microwave cutoff cavity 105. The gas inlet 121 communicates with the gas cylinder 118 storing a first raw material gas therein and the gas cylinder 119 storing a diluting gas therein via the mass flow controllers 115 and 116, respectively.

On the other hand, the reaction vessel 107 is provided therein with a film deposition chamber 108 having the film deposition space, at its end on the side of the second microwave cutoff cavity 106. The film deposition chamber 108 is capable of maintaining a high degree of vacuum therein, and is formed of a material which hardly liberates gases. For instance, the film deposition chamber 108 may be formed of the same material as the reaction vessel 107, or may be made of a metal such as aluminum and stainless steel.

In the film deposition chamber 108, there are disposed the gas inlet pipe 109 having a multiplicity of gas release holes and the substrate holder 111. The substrate 110 for film deposition is placed on the substrate holder 111. In the substrate holder 111 is inserted a heater 112 for heating the substrate, by which the substrate 110 is heated to and maintained at a predetermined temperature. The gas inlet pipe 109 communicates via the mass flow controller 117 with the gas cylinder 120 in which a second raw material gas is stored. A side wall of the film deposition chamber 108 is provided with an exhaust port 113' for evacuating the interior of the chamber, which communicates with an exhaust system 114 via the exhaust pipe 113.

It is a characteristic feature of the apparatus of this invention that the first microwave cutoff cavity 105 and the second microwave cutoff cavity 106 are oppositely disposed and are different in microwave cutoff frequency. Namely, the cutoff frequency ($f_1$) of the first microwave cutoff cavity 105 is set to be higher than the cutoff frequency ($f_2$) of the second microwave cutoff cavity 106. This ensures that the microwave energy transmitted through the waveguide does not leak into the first cavity 105 on the side of the gas inlet 121 but is supplied only into the second cavity 106 on the side of the film deposition chamber 108, and is therefore used efficiently for the formation of the activated species. In addition, the plasma generating space is limited to a required minimum region, so that contamination by the materials constituting the reaction vessel 107 is prevented or minimized.

It is desirable that the sizes of the first and second microwave cutoff cavities are so set that the ratio ($f_1/f_2$) of the cutoff frequency ($f_1$) of the first cavity to the cutoff frequency ($f_2$) of the second cavity is preferably in the range from 1.5 to 100, more preferably from 3 to 50, and most preferably from 5 to 10.

As is clear from the above explanation, the apparatus of this invention has excellent effects particularly in carrying out a process for forming a deposited film in which strict control of plasma discharge is required for obtaining a deposited film having good electrical properties, as in the case where activated specifies generated by excitation of a first raw material gas is reacted with a second raw material gas to form a deposited film.

The substrate for film deposition, used for forming a deposited film by the apparatus of this invention, may be electrically conductive or electrically insulating. For instance, an electrically conductive substrate formed of a metal such as Ni, Cr, Al, Mo, Au, Ir, Nb, Ta, V, Ti, Pt, Pd, etc. or an alloy such as NiCr, stainless steel, etc. Also, an electrically insulating substrate formed of a synthetic resin such as polyester, polyethylene, polycarbonate, cellulose, acetate, polypropylene, polyvinyl chloride, polyvinylidene chloride, polystyrene, polyamide, polyimide, etc., a ceramic such as alumina, silicon nitride, boron nitride, aluminum nitride, forsterite, etc. or other materials such as a single crystal or polycrystalline wafer of Si, GaAs, saphire, etc. or glass or the like may be used. If desired, the insulating substrate may be used after at least one side thereof is appropriately treated to be conductive through deposition of a metal by sputtering, resistance heating vapor deposition, electron beam vapor deposition, plating or the like.

The raw material gases for forming the deposited film are selected as follows. For instance, in the case of forming an A-Si film, the first raw material gas may be $H_2$ gas and/or a halogen gas such as $F_2$ gas, $Cl_2$ gas, gasified $Br_2$, $I_2$, etc., and the diluting gas may be Ar gas, He gas, Ne gas or the like. The first raw material gas may be used after being diluted with the diluting gas to a desired concentration.

The second raw material gas may be a halide of a linear or cyclic silane compound represented by the formula $Si_aH_bX_c$, wherein a and c are each an integer other than O, b is an integer inclusives of O, and X is F, Cl, Br or I. Thus, such a compound as above in the gaseous state or capable of being easily gasified may be used, for example, $SiF_4$, $(SiF_2)_4$, $(SiF_2)_5$, $(SiF_2)_6$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiHBr_3$, $SiHI_3$, $Si_2Cl_3F_3$, $Si_2H_3F_3$, etc.

This invention will now be explained more in detail while referring to the following test examples, in which the apparatus for forming a deposited film by the MW-PCVD process according to this invention, shown in FIG. 1, was used.

TEST EXAMPLE 1

By using the apparatus for forming a deposited film as shown in FIG. 1, formation of a thin film of silicon was carried out in the manner as follows. First, a Corning #7059 glass substrate 110 was placed on the substrate holder 111, and the interior of the film deposition chamber 108 was evacuated to $10^{-5}$ Torr by the exhaust system 114.

While the substrate temperature was maintained at 250° C. by the heater 112 for heating the substrate, $H_2$ gas contained in the gas cylinder 118 and Ar gas contained in the gas cylinder 119 are introduced into the reaction vessel 107 at respective rates of 15 sccm and 200 sccm through the respective mass flow controllers 115, 116 and the gas inlet pipe 121. Simultaneously, $SiF_4$ gas contained in the gas cylinder 120 was introduced into the reaction vessel 107 at a rate of 40 sccm through the mass flow controller 117 and the gas inlet pipe 109. By controlling the exhausting performance of the exhaust system 114, the pressure inside the film deposition chamber 108 was maintained at 700 mTorr. In this condition, microwave energy was generated by the microwave power source 101, and the matching device 103 was controlled while monitoring the outputs of the progressive wave and the reflected wave of the microwaves by a power meter 102 so that the effective power was adjusted to 160 W. The cutoff frequencies $f_1$, $f_2$ of the microwave cutoff cavities 105 and 106 were set at 4 MHz and 8 MHz, respectively, the cutoff frequency ratio ($f_1/f_2$) being 0.5. The cavities 105 and 106 were cylindrical. The microwave energy thus generated was inputted into the reaction vessel 107 through the rectangular waveguide 104 and the cavity 106, whereby a plasma of the $H_2$ gas and $Ar_2$ gas was generated. The H radicals in the plasma reacts with the $SiF_4$ gas introduced through the gas inlet pipe 121 to form a precursor which participates in film formation. The precursor is transported onto the glass substrate 110, and a silicon film is deposited on the substrate. Electric discharge was continued for 2 hours under the above-mentioned condition, to obtain a thin film of silicon on the substrate 110. This thin silicon film was named Specimen No. 1. Subsequently, thin films of silicon were formed under the same film forming conditions in respect of raw material gas flow rates, microwave power, internal pressure, etc. as above except that the ratio ($f_1/f_2$ of the microwave cutoff frequencies $f_1$, $f_2$ of the two cavities was changed as shown in Table 1 by changing the inside diameters of the cylindrical microwave cutoff cavities 105 and 106.

The thin silicon films thus obtained were named Specimen Nos. 2 to 11, respectively. Every one of the specimens obtained was confirmed to be constituted of amorphous silicon by X-ray diffraction.

Figure 2:
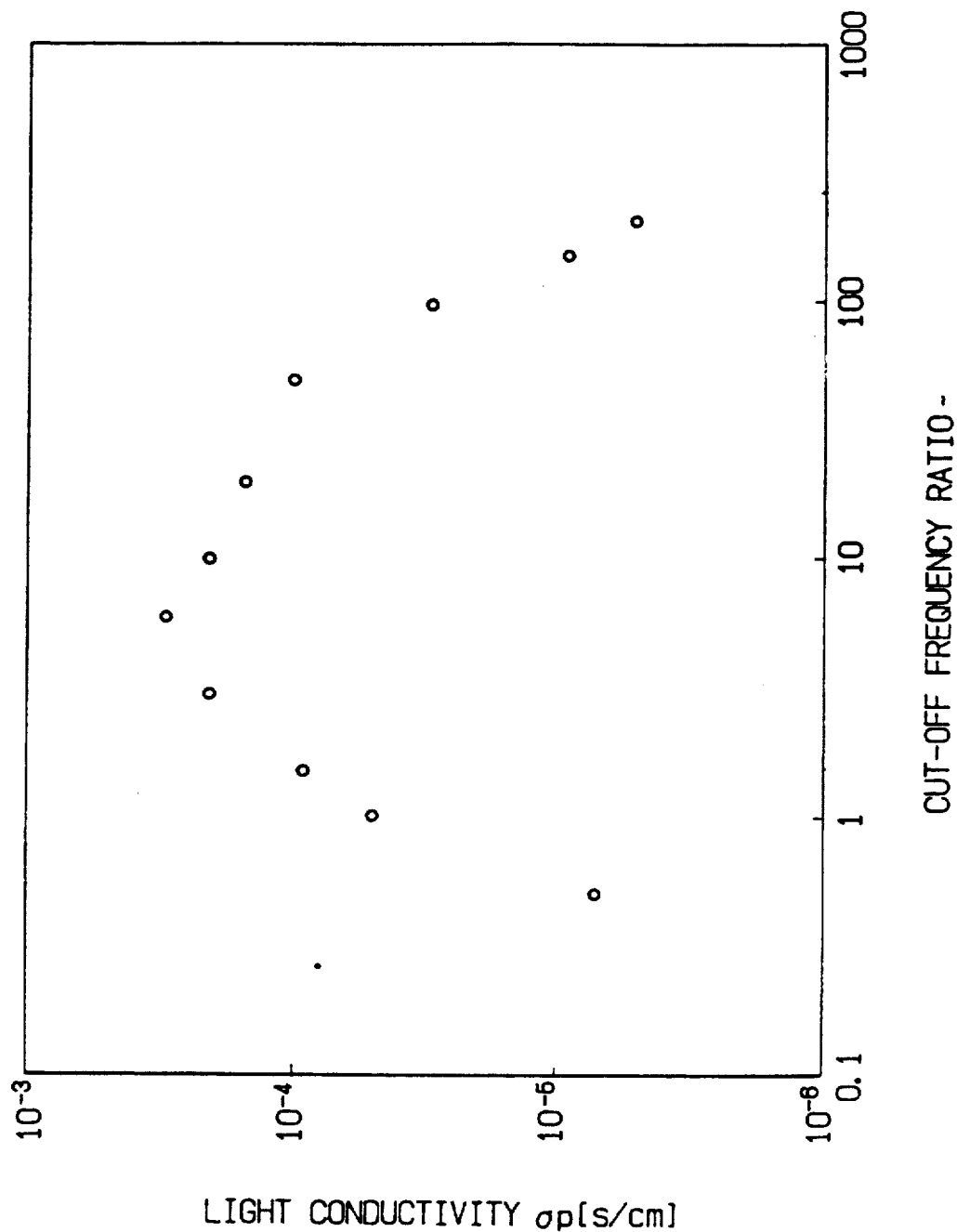

Next, the thickness of each of the specimens obtained above was measured, then the specimen was put into a vacuum deposition system, and a comb-shaped Al electrode (gap length 250 μm, width 5 mm) was deposited in a thickness of 1000 Å under a degree of vacuum of about $10^{-5}$. Torr. The dark current was measured by applying a voltage of 10 V to determine dark conductivity $\delta p$ ($S \cdot cm^{-1}$). The results of the measurement were showing in FIG. 2, which revealed that a film of good quality is obtained when the microwave cutoff frequency ration $f_1/f_2$ is set preferably in the range $1.5 < f_1/f_2 < 100$, more preferably $3 < f_1/f_2 < 50$, optimally $3 < f_1/f_2 < 10$ according to the invention. Since it is clearly seen from the results shown in Table 1 that the film thickness increases with the ration $f_1/f_2$, it was revealed that the microwave energy is used effectively when $f_1/f_2 > 1.5$.

TEST EXAMPLE 2

Thin films of silicon-germanium were formed by the same process and procedure as in Test Example 1 except that the gas in the gas cylinder 120 was replaced by $GeF_4$ (0.4% dilution with $SiF_4$) gas.

The flow rate conditions of the raw material gases were $H_2$ gas 20 sccm, Ar gas 200 sccm and $GeF_4$ (0.4% dilution with $SiF_4$) gas 25 sccm, while the internal pressure was 350 mTorr, and the various values of the microwave cutoff ration ($f_1/f_2$) of the cavities 105 and 106 shown in Table 2 were used. The silicon-germanium films thus obtained were named Specimen Nos. 12 to 22, respectively. For each of the specimens, film thickness was measured, and optical band gap was measured. Each specimen was put into a vacuum deposition system, and a comb-shaped Al electrode (gap length 150 μm, length 5 mm) was deposited in a thickness of 1000 Å. The specimen was taken out of the vacuum deposition system, and measurement of light conductivity $\delta p$ ($S \cdot cm^{-1}$) under irradiation with AM-1 (100 mW/cm²) light and measurement of dark conductivity $\delta d$ ($s \cdot cm^{-1}$) were carried out under an applied voltage of 10 V. The ratios of normal conductivity to dark conductivity were shown in Table 3. The other results are shown in Table 2. FIG. 3 revealed that a film of good quality is obtained when the microwave cutoff frequency ratio ($f_1/f_2$) was set preferably in the range of surements are shown in Table 3. Table 3 revealed that reproducibility of film thickness and electrical properties is good when the microwave frequency ration $f_1/f_2$ is 5.

TABLE 1

| Specimen No. | 1 | 2 | 3 | 4 | 5 | 6 | 7 | 8 | 9 | 10 | 11 |
|---|---|---|---|---|---|---|---|---|---|---|---|
| Cutoff frequency ratio | 0.5 | 1 | 1.5 | 3 | 6 | 10 | 20 | 50 | 100 | 150 | 200 |
| Film thickness (μm) | 0.02 | 0.09 | 0.13 | 0.42 | 0.68 | 1.0 | 1.5 | 2.5 | 3.1 | 3.6 | 4.2 |

TABLE 2

| Specimen No. | 12 | 13 | 14 | 15 | 16 | 17 | 18 | 19 | 20 | 21 | 22 |
|---|---|---|---|---|---|---|---|---|---|---|---|
| Cutoff frequency ratio | 0.5 | 1 | 1.5 | 3 | 6 | 10 | 20 | 50 | 100 | 150 | 200 |
| Film thickness (μm) | 0.01 | 0.07 | 0.12 | 0.40 | 0.63 | 0.95 | 1.3 | 2.3 | 2.9 | 3.4 | 4.0 |

TABLE 3

| Specimen No. | 23 | 24 | 25 | 26 | 27 |
|---|---|---|---|---|---|
| Light conductivity δp (S·cm$^{-1}$) | $3 \times 10^{-5}$ | $4 \times 10^{-5}$ | $4 \times 10^{-5}$ | $3 \times 10^{-5}$ | $2 \times 10^{-5}$ |
| Film thickness (μm) | 0.65 | 0.63 | 0.63 | 0.63 | 0.64 |

$1.5 < f_1/f_2 < 100$, more preferably $3 < f_1 f_2 < 50$, optimally $5 < f_1/f_2 < 10$ according to this invention. Since it is clearly seen from Table 2 that the film thickness incenses with the ration $f_1/f_2$, it was revealed that the microwave energy is used effectively in the case of $f_1/f_2 > 1.5$.

TEST EXAMPLE 3

A thin film of silicon was formed by the same process and procedure as in Test Example 1. The flow rates of H$_2$ gas, Ar gas and SiF$_4$ gas were 15 sccm, 200 sccm and 40 sccm, while the internal pressure was 700 mTorr, and the microwave cutoff frequency ration ($f_1/f_2$) of the cavities 105 and 106 was set to 5. The microwave power was 160 W, and film formation was performed for 2 hours. After the film was formed, the specimen was taken out of the vacuum deposition system, and an Al electrode was formed in the same manner as in Test Example 1. Then, film formation was carried out four times under the same film formation conditions as mentioned above. The specimen thus obtained was named Specimen No. 23. Film formation was carried out further four times under the same film forming conditions as mentioned above, and the specimens thus obtained were named Specimen Nos. 24 to 27, respectively.

Each of the specimens thus obtained was confirmed to be constituted of amorphous silicon by X-ray diffraction. The film thickness and the light conductivity δp (S°cm$^{-1}$) of each specimen were measured in the same manner as in Test Example 1. The results of the measurements are shown in Table 3.

What we claim is:

1. An apparatus for forming a deposited film by a microwave plasma CVD process comprising introducing a film-forming raw material gas into a reaction vessel capable of being vacuum sealed, and generating a microwave-excited plasma in the reaction vessel to deposit a film on a substrate for film deposition disposed in the reaction vessel, the apparatus comprising a waveguide for transmitting microwave energy, a pair of microwave cutoff cavities comprising a first microwave cutoff cavity and a second microwave cutoff cavity, said first and second microwave cutoff cavities (i) having different cutoff frequencies, and (ii) being disposed on opposite sides of the waveguide, and a reaction vessel disposed to penetrate through the waveguide and the first and second microwave cutoff cavities, wherein the first microwave cutoff cavity has a cutoff frequency $f_1$ greater than the cutoff frequency $f_2$ of the second microwave cutoff cavity, a raw material gas inlet being provided at the portion of the reaction vessel which penetrates through the first microwave cutoff cavity, and a film deposition space being provided at the portion of the reaction vessel which penetrates through the second microwave cutoff cavity.

2. The apparatus as set forth in claim 1, wherein a ratio ($f_1/f_2$) of the cutoff frequency $f_1$ of the first microwave cutoff cavity to the cutoff frequency $f_2$ of the second microwave cutoff cavity is from 1.5 to 100.

* * * * *